United States Patent [19]
Inoue

[11] Patent Number: 5,923,048
[45] Date of Patent: Jul. 13, 1999

[54] SEMICONDUCTOR INTEGRATED CIRCUIT DEVICE WITH TEST ELEMENT

[75] Inventor: Itaru Inoue, Yamagata, Japan

[73] Assignee: NEC Corporation, Tokyo, Japan

[21] Appl. No.: 08/864,852

[22] Filed: May 30, 1997

[30] Foreign Application Priority Data

May 30, 1996 [JP] Japan .................................. 8-137162

[51] Int. Cl.$^6$ .................................................. H01L 23/58
[52] U.S. Cl. .......................... 257/48; 257/203; 257/207; 257/208
[58] Field of Search ............................ 257/48, 203, 207, 257/208

[56] References Cited

U.S. PATENT DOCUMENTS

| | | | |
|---|---|---|---|
| 5,477,062 | 12/1995 | Natsume | 257/48 |
| 5,598,010 | 1/1997 | Uematsu | 257/48 |
| 5,734,175 | 3/1998 | Taniguchi | 257/48 |
| 5,739,546 | 4/1998 | Saitou et al. | 257/48 |

FOREIGN PATENT DOCUMENTS

| | | | |
|---|---|---|---|
| 60-246668 | 12/1985 | Japan . | |
| 1-93158 | 4/1989 | Japan . | |
| 4-365347 | 12/1992 | Japan . | |
| 5-343487 | 12/1993 | Japan | 257/48 |

*Primary Examiner*—William Mintel

[57] ABSTRACT

A semiconductor integrated circuit device is provided, which is capable of further reduction in chip size without raising any bad effect to the function of the device, and deletion of the TEG region. A test element is formed on a semiconductor substrate. An insulating layer is formed on or over the substrate to cover the test element. An internal circuitry is formed on the substrate. A bonding pad is formed on the insulating layer. The test element is entirely or partially overlapped with the overlying bonding pad. The bonding pad includes a first part and a second part electrically insulated from each other. The first part of the bonding pad is electrically connected to the internal circuitry. The second part of the bonding pad is electrically connected to a terminal of the test element. On a verification test, one of the probes of a tester is contacted with the second part of the bonding pad, and another one thereof is contacted with the first part or an additional part thereof.

8 Claims, 3 Drawing Sheets

SEMICONDUCTOR INTEGRATED CIRCUIT DEVICE WITH TEST ELEMENT

BACKGROUND OF THE INVENTION

1. Field of the Invention

The present invention relates to a semiconductor integrated circuit device and more particularly, to a semiconductor integrated circuit device having a test element for monitoring the process parameters of the circuit.

2. Description of the Prior Art

With a conventional semiconductor integrated circuit device, typically, a group of test elements are provided on a semiconductor chip to measure the electrical characteristics of electrical elements and/or circuits formed in the internal circuitry of the device, thereby monitoring the process parameters for the device.

The group of test elements is termed the "Test Element Group (TEG)". The TEG is laid out in a dedicated region separated from the internal circuits on the chip, which is termed the "TEG region".

A conventional semiconductor integrated circuit device of this sort is shown in FIG. 1, which is disclosed in the Japanese Non-Examined Patent Publication No. 4-365347 published in December 1992.

In FIG. 1, the reference numeral 120 indicates a TEG region, in which three transistors 122 are provided as the test elements. Each of the transistors 122 is here a three-terminal transistor. The test transistors 122 have the same configuration as that of the transistors formed in the internal circuitry of the device.

The three terminals of each transistor 122 are electrically connected to respective electrodes 121 through corresponding wiring lines 123. The three electrodes 121 are arranged to surround the corresponding transistor 122. In other words, the transistor 122 is located among the corresponding three electrodes 121.

Typically, the electrodes 121 are made of aluminum and the wiring lines 123 are made of polysilicon. The electrodes 121 are designed to have a size or area allowing the probes of a verification tester (not shown) to be contacted therewith, respectively.

Although each of the test transistors 122 is located along the corresponding three electrodes 121 in FIG. 1, the above Patent Publication No. 4-365347 discloses that it may be located below the electrodes 121 to be overlapped therewith for the purpose of reducing the chip area of the TEG region 120. Similarly, it further discloses that the wiring lines 123 may be located below the electrodes 121 to be overlapped therewith.

Additionally, bonding pads onto which bonding wires are bonded are provided on the chip separately from the TEG region 120.

A technique of arranging an electrical element or circuit below a bonding pad for the purpose of wire bonding to be overlapped therewith is disclosed in the Japanese Non-Examined Patent Publication No. 60-246668 published in December 1985.

In this technique, for example, an input/output (I/O) protection circuit for protecting the internal circuitry is arranged below the bonding pad. The I/O circuit may be formed by a diode or the combination of a diode and a resistor. There is an advantage that the input and output of the internal circuitry are protected by the protection circuit without increasing the chip area of a semiconductor integrated circuit devices However, with the conventional semiconductor integrated circuit of FIG. 1, which is disclosed in the Japanese Non-Examined Patent Publication No. 4-365347, there is a problem that it is very difficult to decrease the chip area of the TEG region 120 itself. The reason is that each of the electrodes 121 in the TEG region 120 necessitates a specific wide area or size allowing the test probes to be in contact therewith even if the test elements 122 are miniaturized to the lower limit. This means that it is essential for the TEG region 120 to occupy a specific wide area on the chip.

On the other hand, with the technique disclosed in the Japanese Non-Examined Patent Publication No. 60-246668, there is a problem that the electrical element or circuit such as the I/O protection circuit arranged below the bonding pad may not operate normally. This is caused by the fact that the element or circuit located below the bonding pad tends to be damaged or destroyed due to the applied stress during a wire bonding process. This problem will make it impossible to use the semiconductor integrated circuit device.

SUMMARY OF THE INVENTION

Accordingly, an object of the present invention is to provide a semiconductor integrated circuit device capable of further reduction in chip size without raising any bad effect to the function of the device.

Another object of the present invention is to provide a semiconductor integrated circuit device that is able to delete the TEG region on a semiconductor chip.

The above objects together with others not specifically mentioned will become clear to those skilled in the art from the following description.

A semiconductor integrated circuit device according to a first aspect of the present invention includes a semiconductor substrate, a test element formed on the substrate, an insulating layer formed on or over the substrate to cover the test element, an internal circuitry formed on the substrate, and a bonding pad formed on the insulating layer.

The test element is entirely or partially overlapped with the bonding pad. It is preferred that the test element is entirely overlapped with the bonding pad.

The bonding pad includes a first part and a second part electrically insulated from each other. The first part of the bonding pad is electrically connected to the internal circuitry The second part of the bonding pad is electrically connected to a terminal of the test element.

With the semiconductor integrated circuit device according to the first aspect of the present invention, the test element is entirely or partially overlapped with the overlying bonding pad, and the bonding pad includes a first part and a second part electrically insulated from each other. Further, the first part of the bonding pad is electrically connected to the internal circuitry, and the second part thereof is electrically connected to a terminal of the test element.

Therefore, by contacting one of the probes of a tester with the second part of the bonding pad, and another one thereof with the first part or an additional part of the bending pad on a verification test, the verification test can be performed.

If any other part of the bonding pad is additionally formed as necessary, any verification test can be performed according to the number of the terminals of the test element.

On the other hand, the test element is located below the bonding pad. Accordingly, even if the test element is damaged or destroyed due to the applied stress during a subsequent wire-bonding process, no bad effect is applied to the function of the device.

As a result, the chip size of the semiconductor integrated circuit can be further reduced without raising any bad effect to the function of the device.

Further, the first part of the bonding pad serves to electrically connect the internal circuitry to the bonding wire. The second part of the bonding pad (and any additional part thereof) serves as an electrode (or, electrodes) of the test element on a verification test. This means that the electrodes for the test element are not necessary.

Consequently, the TEG region dedicated to the TEG can be deleted from a semiconductor chip.

In a preferred embodiment of the device according to the first aspect of the present invention, the test element has two terminals. One of the two terminals is electrically connected to the first part of the bonding pad, and another ore of the two terminals is electrically connected to the second part of the bonding pad.

In another preferred embodiment of the device according to the first aspect, the bonding pad further has a third part, and the test element has two terminals. The two terminals are electrically connected to the second and third parts of the bonding pad, respectively.

In still another preferred embodiment of the device according to the first aspect, the bonding pad further has a third part, and the test element has three terminals. The three terminals are electrically connected to the first, second, and third parts of the bonding pad, respectively.

A semiconductor integrated circuit device according to a second aspect of the present invention includes a semiconductor substrate, a test element formed on the substrate, an insulating layer formed on or over the substrate to cover the test element, an internal circuitry formed on the substrate, and first and second bonding pads formed on the insulating layer.

The test element has two terminals. The test element is located between the first and second bonding pads. The test element may be partially overlapped with at least one of the first and second bonding pads. It is preferred that the test element is overlapped with the firs and second bonding pads.

Each of the first and second bonding pads includes a first part and a second part electrically insulated from each other. The first part is electrically connected to the internal circuitry. The second part is electrically connected to a corresponding one of the two terminals of the test element With the semiconductor integrated circuit device according the second aspect of the present invention, the test element is located between the overlying first and second bonding pads, and each of the first and second bonding pads includes a first part and a second part electrically insulated from each other. The first part is electrically connected to the internal circuitry formed on the substrate. The second part is electrically connected to a corresponding one of the two terminals of the test element.

Therefore, by contacting two probes of a tester with the respective second parts of the first and second bonding pads on a verification test, the verification test can be performed.

If any other part of the bonding pad is additionally formed as necessary, any verification test can be performed according to the number of the terminals of the test element.

On the other hand, the test element is located below the first and second bonding pads. Accordingly, even if the test element is damaged or destroyed due to the applied stress during a subsequent wire-bonding process, no bad effect is applied to the function of the device.

As a result, the chip size of the semiconductor integrated circuit can be further reduced without raising any bad effect to the function of the device.

Further, the first part of each of the first and second bonding pads serves to electrically connect the internal circuitry to the bonding wire. The second part of each of the first and second bonding pads (and any additional part thereof) serves as an electrode (or, electrodes) of the test element on a verification test. This means that the electrodes for the test element are not necessary.

Consequently, the TEG region dedicated to the TEG can be deleted from a semiconductor chip.

In a preferred embodiment of the device according to the second aspect of the present invention, the first parts of the first and second bonding pads are electrically connected in Common to the internal circuitry to allow a large current to flow through the first and second bonding pads.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described below referring to the FIGS. 2 to 5 attached.

FIRST EMBODIMENT

Figure 2:
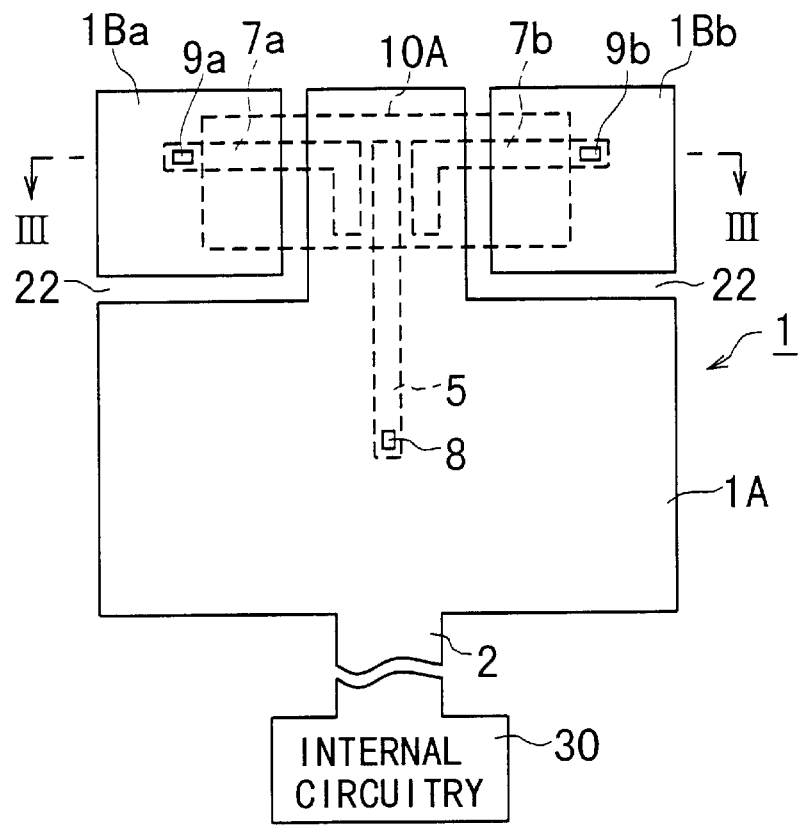
FIG. 2 is a schematic, partial plan view of a semiconductor integrated circuit device according to a first embodiment of the present invention, which shows the configuration in the vicinity of a bonding pad for an internal circuitry of the device.
Figure 3:
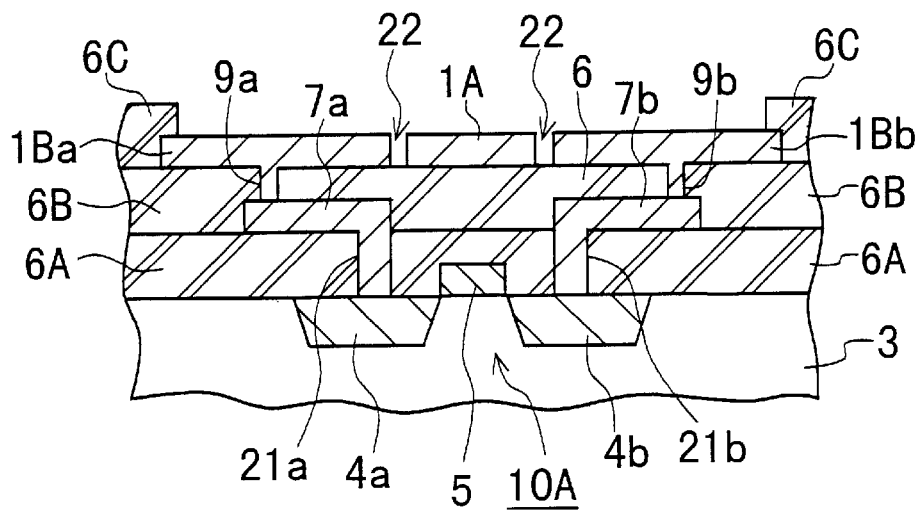
FIG. 3 is a schematic, cross-sectional view along the line III—III in FIG. 2.

A semiconductor integrated circuit according to a first embodiment has a configuration as shown in FIGS. 2 and 3

It is needless to say that this semiconductor integrated circuit device includes a lot of bonding pads and a lot of test elements. However, for the sake of simplification, only one of the bonding pads and only one of the test elements are shown in FIGS. 2 and 3 and explained in the specification.

In FIGS. 2 and 3, a pair of source/drain regions 4a and 4b are formed in a silicon substrate 3 to be apart from each other. A gate electrode 5 is formed on a main surface of the substrate 3 through a gate oxide layer (not shown) between the pair of source/drain regions 4a and 4b. The pair of source/drain regions 4a and 4b and the gate electrode 5 constitute a Metal-Oxide-Semiconductor Field-Effect Transistor (MOSFET) serving as a test transistor 10A.

A first interlayer insulating layer 6A is formed on the main surface of the substrate 3 to cover the transistor 10A. The layer 6A has contact holes 2a and 21b at the locations just over the source/drain regions 4a and 4b, respectively.

Patterned wiring lines 7a and 7b are formed on the first interlayer insulating layer 6A to be contacted with and electrically connected to the source/drain regions 4a and 4b through the contact holes 21a and 21b, respectively. The wiring lines 7a and 7b are formed by patterning a polysilicon layer.

A second interlayer insulating layer 6B is formed on the first interlayer insulating layer 6A to cover the wiring lines 7a and 7b. The layer 6B has contact holes 9a and 9b at the locations just over the wiring lines 7a and 7b, respectively.

An internal circuitry 30 is formed or the substrate 3, which provides the specific function of functions of the semiconductor integrated circuit device according to the first embodiment.

A bonding pad 1 is formed on the second interlayer insulating layer 6B. The pad 1 is used for electrically connecting the internal circuitry 30 to a bonding wire (not shown). In other words, a bonding wire is bonded onto the pad 1 by a popular wire bonding process.

A passivation layer 6C is formed on the second interlayer insulating layer 6B over the whole substrate 3. The layer 6C has a window through which the bonding pad 1 is exposed from the layer 6C.

As clearly shown in FIG. 2, here, the bonding pad 1 has a plan shape of approximately square. The pad 1 is divided into three parts by two L-shaped gaps 22. In other words, the pad 1 is formed by a main part 1A and two sub parts 1Ba and 1Bb. The sub parts 1Ba and 1Bb are separated from and electrically insulated from the main part 1A. Each of the sub parts 1Ba and 1Bb also has a plan shape of approximately square. The main part 1A is much larger than each of the sub parts 1Ba and 1Bb.

The main part 1A is electrically connected to the gate electrode 5 through a contact hole 8 formed to vertically penetrate the first and second interlayer insulating layers 6A and 6B. The contact hole 8 is located at approximately the center of the pad 1, as shown in FIG. 2. The gate electrode 5 extends to the contact hole 8. The main part 1A of the pad 1 is electrically connected to the internal circuitry 30 through a wiring line 2.

The sub parts 1Ba and 1Bb are electrically connected to the source/drain regions 4a and 4b through the wiring lines 7a and 7b, respectively.

Figure 1:
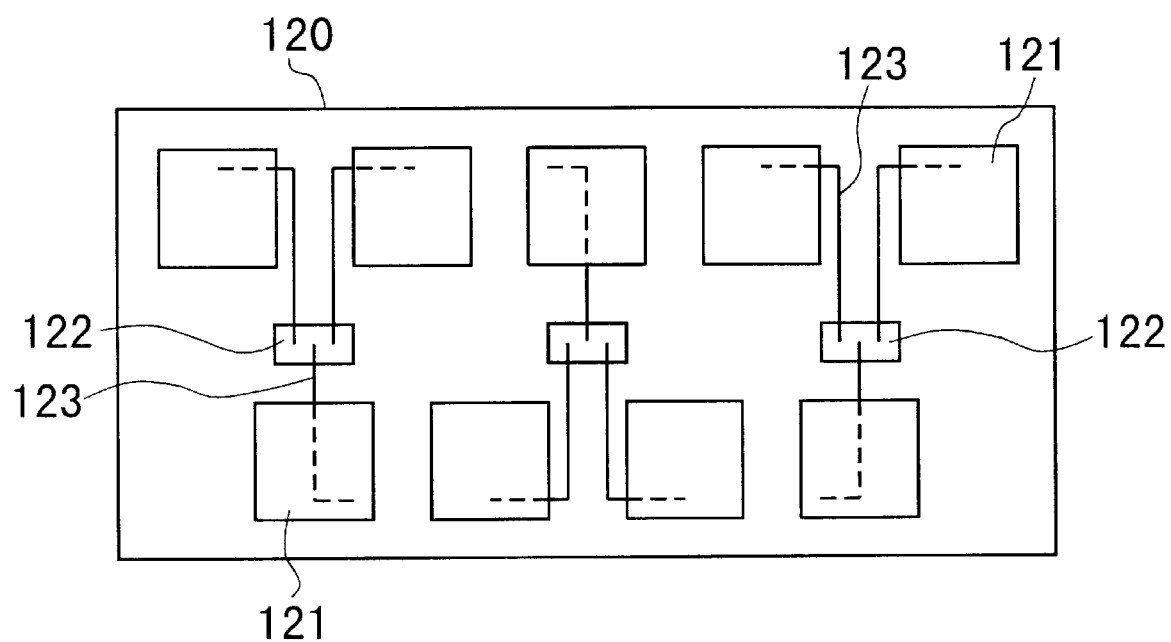
FIG. 1 is a schematic, partial plan view showing the layout of test elements in a TEG region of a conventional semiconductor integrated circuit.

The MOSFET 10A serving as the test element is entirely located below the bonding pad 1 in other words, the bonding pad 1 is overlapped with the whole MOSFET 10A in such a way that the sub parts 1Ba and 1Bb and the intervening area of the main part LA entirely covers the MOSFET 10A, as shown in FIG. 1A.

The bonding pad I has a enough size for the wire bonding process.

As seen from FIG. 2, in this embodiment, the two sub parts 1Ba and 1Bb are arranged at the opposite end to the internal circuitry 30 on the semiconductor chip. The sub parts 1Ba and 1Bb are located at the two corners of the bonding pad 1, respectively. The MOSFET 10A is positioned in the vicinity of the opposite end of the pad 1 to the internal circuitry 30.

Next, the use of the semiconductor integrated circuit device according to the first embodiment is explained below.

On a verification test, the three probes (not shown) of a tester are contacted with the main and sub parts 1A, 1Ba, and 1Bb of the bonding pad 1, respectively. Specifically, one of the three probes is electrically connected to the gate electrode 5 of the MOSFET 10A, and at the same time, the remaining two of the three probes are electrically connected to the source/drain regions 4a and 4b, respectively. Then, to measure the electrical characteristics of the MOSFET 10A, specific electric signals are inputted to or outputted from the gate electrode 5 and the source/drain regions 4a and 4b through the corresponding probes, respectively.

After the verification test is finished, a bonding wire (not shown) is bonded onto the pad 1 through a popular wire bonding process, thereby electrically connecting the bonding wire to the internal circuitry 30 of this integrated circuit device through the main part 1A of the pad 1.

No problem occurs even if the bonded wire is contacted with at least one of the sub parts 1A and 1B at this stage. The reason is that the sub parts 1A and 1B are not electrically connected to the internal circuitry 30, and that the MOSFET 10A will not operate even in this case.

There is a possibility that the MOSFET 10A is destroyed or damaged due to the applied pressure during the wire bonding process so that the gate electrode 5 and the source/drain regions 4a and 4b are electrically short and/or the wiring lines 7a and 7b are cut. However, the MOSFET 10A will not operate even in this case. Therefore, no problem will occur due to the destruction or damage of the MOSFET 10A.

As described above, with the semiconductor integrated circuit device according to the first embodiment, the test element 10A is entirely overlapped with the overlying bonding pad 1, and the bonding pad 1 includes the main part 1A and two sub parts 1Ba and 1Bb electrically insulated from each other. Further, the main part 1A is electrically connected to the internal circuitry 30 through the wiring line 2, and the two sub parts 1Ba and 1Bb are electrically connected to a terminal of the test element.

Therefore, by contacting two ones of the probes of a tester with the sub parts 1Ba and 1Bb of the pad 1, and the remaining one thereof with the main part 1A of the pad 1 on a verification test, the verification test can be performed.

On the other hand, the test element 10A is located below the bonding pad 1. Accordingly, even if the test element 10A is damaged or destroyed due to the applied stress during a subsequent wire-bonding process, no bad effect is applied to the function of this device.

As a result, the chip size of the semiconductor integrated circuit device can be further reduced without raising any bad effect to the function of this device.

Further, the main part 1A of the bonding pad 1 serves to electrically connect the internal circuitry 30 to the bonding wire. The sub parts 1Ba and 1Bb of the bonding pad 1 serve as electrodes of the test element 10A on the verification test. This means that the testing electrodes for the test element 10A are not necessary.

Consequently, the TEG region dedicated to the TEG can be deleted from a semiconductor chip.

SECOND EMBODIMENT

Figure 4:
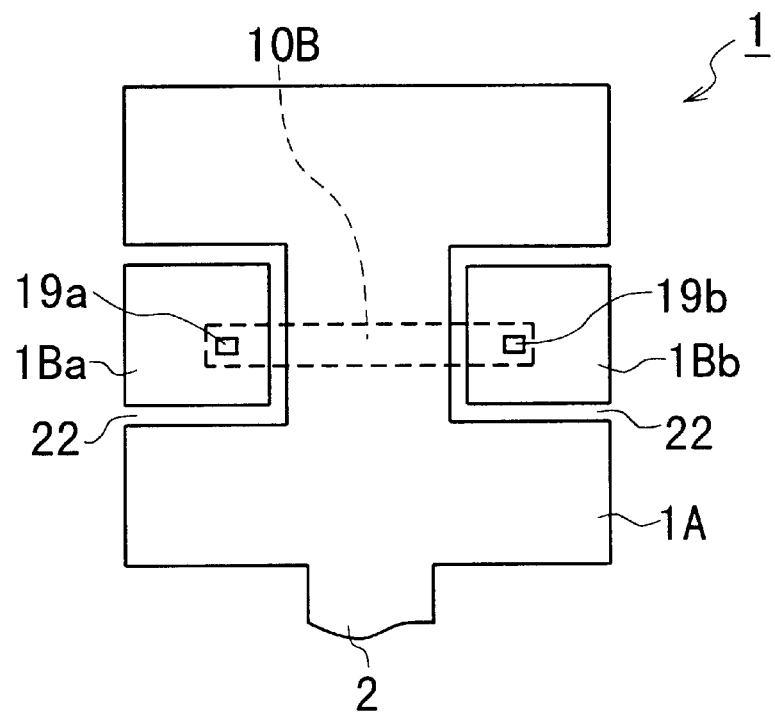
FIG. 4 is a schematic, partial plan view of a semiconductor integrated circuit device according to a second embodiment of the present invention, which shows the configuration in the vicinity of a bonding pad for an internal circuitry of the device.

A semiconductor integrated circuit according to a second embodiment is shown in FIG. 4, which is the same in configuration as that according to the first embodiment, except that the two sub parts 1Ba and 1Bb of the bonding pad 1 are arranged on the substrate 3 at approximately the center of each side of the pad 1 and that a two-terminal test element 10B is provided at approximately the center of the pad 1.

Therefore, the description relating to the same configuration as that of the first embodiment is omitted here by adding the same reference numerals to the corresponding elements in FIG. 4 for the sake of simplification of description.

In the second embodiment, in the same manner as that in the first embodiment, the two-terminal transistor 10B serving as the test element is formed on the semiconductor substrate 3. The sub parts 1Ba and 1Bb of the bonding pad 1 are electrically connected to the underlying wiring lines 7a and 7b through underlying contact holes 19a and 19b, respectively. The contact holes 19a and 19b are formed in the second interlayer insulating layer 6B to be overlapped with the wiring lines 7a and 7b, respectively.

As shown in FIG. 4, the transistor 10B has a linear plan shape extending from one of the contact holes 19a and 19b to the other one thereof.

The use of the semiconductor integrated circuit device according to the second embodiment is the same as that of the first embodiment, except that the two probes (not shown) of a tester are contacted with and electrically connected to the two sub parts 1Ba and 1Bb of the bonding pad 1, respectively an a verification test.

After the verification test is finished, in the same manner as that of the first embodiment, a bonding wire (not shown) is bonded onto the pad 1 through a popular wire bonding process, thereby electrically connecting the bonding wire to the internal circuit of this integrated circuit through the main part 1A and the sub parts 1Ba and 1Bb of the pad 1, Accordingly, also in the semiconductor integrated circuit according to the second embodiment, the TEG region on the semiconductor chip can be deleted, enabling further reduction in chip size.

THIRD EMBODIMENT

Figure 5:
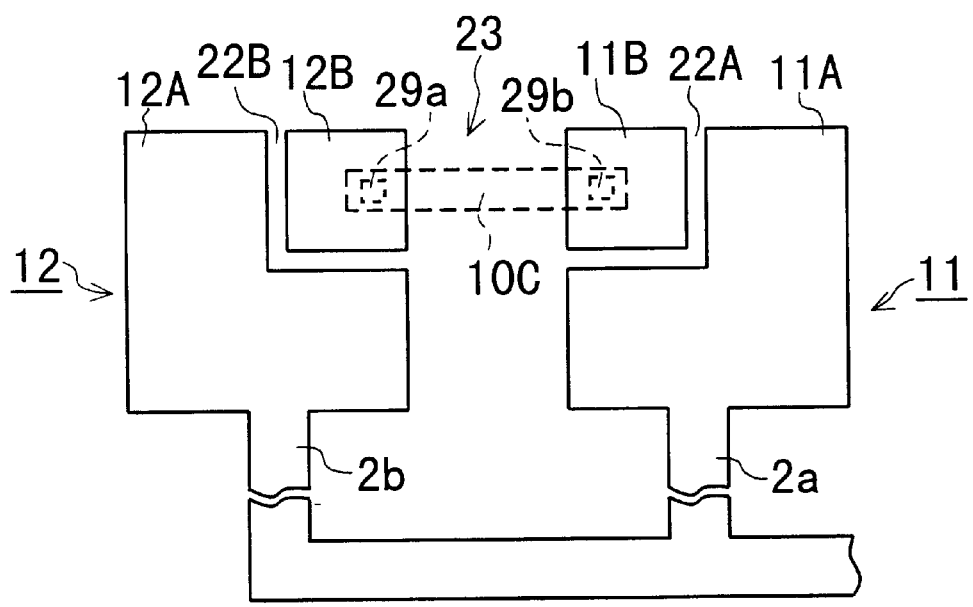
FIG. 5 is a schematic, partial plan view of a semiconductor integrated circuit device according to a third embodiment of the present invention, which shows the configuration in the vicinity of a bonding pad for an internal circuitry of the device.

A semiconductor integrated circuit according to a third embodiment is shown in FIG. 5.

In the third embodiment, unlike the first and second embodiments, two bonding pads 11 and 12 are provided to allow a large current to flow through the pads 11 and 12, and a two-terminal transistor 10C serving as a test element is located between the two pads 11 and 12 so as to link them together.

Specifically, the first and second bonding pads 11 and 12 are formed on the second interlayer insulating layer 6B. The pads 11 and 12 are used for electrically connecting the internal circuitry 30 of this semiconductor integrated circuit device to an external circuit (not shown). In other words, two bonding wires (not shown) are bonded onto the respective pads 11 and 12 by a popular bonding process of this device.

As shown in FIG. 5, the first bonding pad 11 has a plan shape of approximately square. The pad 11 is divided into two parts by an L-shaped gap 22A. In other words, the pad 11 is formed by a main part 11A and a sub part 11B. The sub part 11B is separated from and electrically insulated from the main part 11A. The sub part 11B has a plan shape of approximately square. The main part 11A is much larger than the sub part 11B. The main part 11A is electrically connected to the internal circuitry 30 of this device through a wiring line 2a. The sub part 11B is electrically connected to one of the two terminals of the test transistor 10B.

Similarly, the second bonding pad 12 has a plan shape of approximately square. The pad 12 is divided into two parts by an L-shaped gap 22B. In other words, the pad 12 is formed by a main part 12A and a sub part 12B. The sub part 12B is separated from and electrically insulated from the main part 12A. The sub part 12B has a plan shape of approximately square. The main part 12A is much larger than the sub part 11B. The main part 11A is electrically connected to the internal circuitry 30 of this device through a wiring line 2b. The sub part 11B is electrically connected to another one of the two terminals of the test transistor 10B.

The MOSFET 10A serving as the test element is located between the sub parts 11B and 12B of the first and second bonding pads 11 and 12 to be partially overlapped with the sub parts 11B and 12B.

Each of the first and second bonding pads 11 has a size large enough for the wire bonding process.

As seen from FIG. 5, in this embodiment, the sub parts 11B and 12B are arranged at the opposite ends of the pad 11 and 12 to the internal circuitry 30, respectively. The sub parts 11B and 12B are located at outer corners of the bending pads 11 and 12, respectively. The transistor 10B is positioned in the vicinity of the sub parks 11B and 12B.

In the third embodiment, in the same manner as that in the first embodiment, the two-terminal transistor 10C serving as the test element is formed on the semiconductor substrate 3, The sub parts 11B and 12B of the first and second bonding pads 11 and 12 are electrically connected to the underlying wiring lines 7a and 7b through underlying contact holes 29a and 29b, respectively. The contact holes 29a and 29b are formed in the second interlayer insulating layer 6B to be overlapped with the wiring lines 7a and 1b, respectively.

As shown in FIG. 5, the transistor 10C has a linear plan shape extending from one of the contact holes 29a and 29b to the other one thereof.

The use of the semiconductor integrated circuit device according to the third embodiment is the same as that of the first embodiment, except that the two probes (not shown) of a tester are contacted with and electrically connected to the sub parts 11B and 12B of the first and second bonding pads 11 and 12, respectively, on a verification test.

After the verification test is finished, in the same manner as that of the first embodiment, a bonding wire (not shown) is bonded onto each of the pads 11 and 12 through a popular wire bonding process, thereby electrically connecting the bonding wires to the internal circuitry 30 through the main parts 11A and 12A of the bonding pads 11 and 12 and the corresponding wiring lines 2a and 2b.

Accordingly, also in the semiconductor integrated circuit according to the third embodiment, the TEG region on the semiconductor chip can be deleted, enabling further reduction in chip size.

In the above first to third embodiments, a transistor is provided as the test element. However, any other circuit element or any combination of specific circuit elements may be used as the test element. Also, the plan shape and the layout of the bonding pad may be changed as necessary.

The number of the sub parts of the bonding pad is set as two in the first and second embodiments and one in the third embodiment. However, it is needless to say that this number may be any other number such as three or more as necessary if no problem occurs in the wire bonding process.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A semiconductor integrated circuit device comprising:

a semiconductor substrate;

a test element formed on said substrate;

an insulating layer formed on or over said substrate to cover said test element;

an internal circuitry formed on said substrate; and a bonding pad formed on said insulating layer to be overlapped with said test element;

wherein said bonding pad includes a first part and a second part electrically insulated from each other;

and wherein said firs part of said bonding pad is electrically connected to said internal circuitry;

and wherein said second part of said bonding pad is electrically connected to a terminal of said test element.

2. The device as claimed in claim 1, wherein said test element is entirely overlapped with said bonding pad.

3. The device as claimed in claim 1, wherein said test element has two terminals;

and wherein one of said two terminals is electrically connected to said first part of said bonding pad, and another one of said two terminals is electrically connected to said second part of said bonding pad.

4. The device as claimed in claim 1, wherein said bonding pad further has a third park, and said test element has two terminals;

and wherein said two terminals are electrically connected to said second and third parts of said bonding pad, respectively.

5. The device as claimed in claim 1, wherein said bonding pad further has a third part, and said test element has three terminals;

and wherein said three terminals are electrically connected to said first, second, and third parts of said bonding pad, respectively.

6. A semiconductor integrated circuit device comprising:

a semiconductor substrate;

a test element formed on said substrate;

an insulating layer formed on or over said substrate to cover said test element;

an internal circuitry formed on said substrate; and first and second bonding pads formed on said insulating layer;

wherein said test element has two terminals;

and wherein said test element is located between said the first and second bonding pads;

and wherein each of said first and second bonding pads includes a first part and a second part electrically insulated from each other;

and wherein said first part is electrically connected to said internal circuitry, and said second part is electrically connected to a corresponding one of said two terminals of said test element.

7. The device as claimed in claim 6, wherein said test element is overlapped with at least one of said first and second bonding pads.

8. The device as claimed in claim 6, wherein said first parts of said first and second bonding pads are electrically connected in common to said internal circuitry to allow a large current to flow through said first and second bonding pads.

* * * * *

UNITED STATES PATENT AND TRADEMARK OFFICE
CERTIFICATE OF CORRECTION

PATENT NO.    : 5,923,048
DATED         : July 13, 1999
INVENTOR(S)   : Inoue

It is certified that error appears in the above-identified patent and that said Letters Patent is hereby corrected as shown below:

On the title page, Item [56] add under foreign documents

-- 7-20198   01/1995   Japan. --.

Signed and Sealed this

Twenty-eighth Day of November, 2000

Attest:

Q. TODD DICKINSON

*Attesting Officer*          *Director of Patents and Trademarks*